United States Patent
Gebauer et al.

(10) Patent No.: US 6,872,594 B2
(45) Date of Patent: Mar. 29, 2005

(54) METHOD OF FABRICATING AN ELECTRONIC COMPONENT

(75) Inventors: Uta Gebauer, München (DE); Ingo Wennemuth, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/663,200

(22) Filed: Sep. 16, 2003

(65) Prior Publication Data

US 2004/0063245 A1 Apr. 1, 2004

Related U.S. Application Data

(62) Division of application No. 10/047,028, filed on Jan. 16, 2002, now Pat. No. 6,686,648.

(30) Foreign Application Priority Data

Jan. 16, 2001 (DE) .......................................... 101 01 875

(51) Int. Cl.[7] .............................................. H01L 21/44
(52) U.S. Cl. ...................................... 438/107; 438/113
(58) Field of Search ................................ 438/107, 109, 438/113, 114, 460, 462

(56) References Cited

U.S. PATENT DOCUMENTS

| | | | |
|---|---|---|---|
| 3,921,916 A | * 11/1975 | Bassous | 239/601 |
| 4,930,216 A | * 6/1990 | Nelson | 29/854 |
| 5,055,696 A | * 10/1991 | Haraichi et al. | 250/492.2 |
| 5,107,586 A | 4/1992 | Eichelberger et al. | |
| 5,126,286 A | 6/1992 | Chance | |
| 5,270,493 A | * 12/1993 | Inoue et al. | 174/253 |
| 5,478,781 A | 12/1995 | Bertin et al. | |
| 5,481,133 A | 1/1996 | Hsu | |
| 5,517,057 A | 5/1996 | Beilstein, Jr. et al. | |
| 5,656,553 A | 8/1997 | Leas et al. | |
| 5,673,478 A | * 10/1997 | Beene et al. | 29/830 |
| 5,688,721 A | 11/1997 | Johnson | |
| 5,857,858 A | * 1/1999 | Gorowitz et al. | 439/86 |
| 5,880,011 A | 3/1999 | Zablotny et al. | |
| 6,034,438 A | 3/2000 | Petersen | |
| 6,080,655 A | * 6/2000 | Givens et al. | 438/626 |

FOREIGN PATENT DOCUMENTS

| | | | | |
|---|---|---|---|---|
| JP | 07006982 A | * | 1/1995 | H01L/21/301 |
| JP | 2000-252411 A | | 9/2000 | |

* cited by examiner

*Primary Examiner*—Matthew Smith
*Assistant Examiner*—Lex H. Malsawma
(74) *Attorney, Agent, or Firm*—Laurence A. Greenberg; Warner H. Stemer; Ralph E. Locher (57) ABSTRACT

The electronic component has semiconductor chips that are stacked on one another. On their active top sides, the chips having interconnects for rewiring to contact areas through contacts formed on the sawn edges of the semiconductor chip. The electronic components of overlying and underlying semiconductor chips are thus connected to one another via the through contacts.

13 Claims, 7 Drawing Sheets

METHOD OF FABRICATING AN ELECTRONIC COMPONENT

CROSS-REFERENCE TO RELATED APPLICATION

This application is a divisional of U.S. application Ser. No. 10/047,028, filed Jan. 16, 2002 now U.S. Pat. No. 6,686,648.

BACKGROUND OF THE INVENTION

Field of the Invention

The invention relates to an electronic component with semiconductor chips that are stacked one on the other and a method for fabricating the component.

Electronic components are stacked to form larger hybrid units after the completion of each individual device with a semiconductor chip and a lead frame. Via the different lead frames the finished devices that are stacked one above the other are connected to form an electronic component with semiconductor chips stacked one on the other, wherein the outer flat conductors of the lead frames are connected to one another via corresponding external contact pins. Electronic components comprising stacked individual devices which are formed in this way have the disadvantage that they cannot be produced in a compact design, especially as each lead frame between the devices has a large space requirement.

SUMMARY OF THE INVENTION

It is accordingly an object of the invention to provide an electronic component and a method for fabricating the component, which overcome the above-mentioned disadvantages of the heretofore-known devices and methods of this general type and wherein the advantages of planar technology can be used and wherein it is possible to obtain significantly more compact structures for electronic components comprising stacked individual parts.

With the foregoing and other objects in view there is provided, in accordance with the invention, an electronic component, comprising:

a stack of a plurality of semiconductor chips each having an active top side and a sawn edge;

contact areas and interconnects formed on the active top side for rewiring to contact areas of respectively adjacent (overlying and/or underlying) semiconductor chips; and the interconnects connecting to the contact areas on the active top side, extending toward the sawn edge of the semiconductor chip, and connecting to the respectively adjacent semiconductor chips via through-contacts formed at the sawn edge of the semiconductor chip.

In other words, the electronic component comprises semiconductor chips which are stacked one on the other and have, on their active top side, contact areas and interconnects for rewiring to contact areas of overlying or underlying semiconductor chips. To that end, the interconnects for rewiring are arranged on the top side of the semiconductor chip and connected to the contact areas. The interconnects for rewiring extend from the contact areas on the active top side of the semiconductor chips to the edges of the semiconductor chip and are connected to overlying and underlying semiconductor chips via through contacts, which are arranged on sawn edges of the semiconductor chip.

Such an electronic component has the advantage that a plurality of semiconductor chips which are stacked one on the other can be arranged without having to arrange complicated lead frames in between. Rather, the connections between semiconductor chips that are stacked one above the other are realized by the through contacts arranged on sawn edges of the semiconductor chip. This technology makes full use of the advantage of planar technology in that, before a wafer is actually divided, it is possible to complete all the through contacts in the region of the sawing tracks and through contacts are produced only when the wafer is divided into individual semiconductor chips, said through contacts being configured in circle segment form in cross section. The sawing ensures that the through contacts are arranged at the edge of each chip and are thus easily accessible for connection to the underlying interconnects for rewiring.

In one embodiment of the invention, the bottommost semiconductor chip has solder deposits instead of through contacts. In a further preferred embodiment of the invention, said deposits may be screen printing solder deposits. These solder deposits may have the effect that upon the emplacement of the next semiconductor chip and heating to soldering temperature the solder melt rises on account of capillary action in the through contact holes arranged at the edge of overlying semiconductor chips. To that end, the through contact holes have, on the one hand, an adhesion promoter layer and, on the other hand, a solderable coating, preferably made of copper, silver, gold or alloys thereof. These metals are distinguished by the fact that they are readily wettable and consequently exhibit a great capillary action for the through contacts.

In a further embodiment of the invention, a rewiring plane is in each case arranged between the stacked semiconductor chips. These rewiring planes in no way correspond to a lead frame of an electronic component with semiconductor chips. The rewiring plane is merely formed from the interconnects for rewiring, which, in a further embodiment of the invention, are arranged on an insulating layer on the active semiconductor top side. This insulating layer is patterned in such a way that the contact areas remain uncovered for access to the electronic circuits of the semiconductor chip and the interconnects can be applied unimpeded with relatively inexpensive means for rewiring. That also includes the screen printing of such interconnects on the insulating layer.

In a further embodiment of the invention, the through contacts themselves have an adhesion promoter layer on their inner wall, which layer may preferably be composed of titanium and/or a titanium alloy. Said adhesion promoter layer is intended to facilitate the transition from the semiconductor material to the soldering material and at the same time ensure that a solderable surface coating becomes possible on the inner wall of the through hole. As mentioned above, such an inner coating may again be formed from copper, silver or gold in order to improve the wetting with a solder material.

The insulating layer provided between the semiconductor chip surface and the interconnects for rewiring is preferably a polymer, in particular a polyimide layer.

Since the through contacts, the coating of the inner wall of the through contacts and the provision of the interconnects for rewiring can be carried out at a wafer level, i.e. simultaneously for many semiconductor chips, this electronic component has the advantage that it can predominantly be fabricated with the aid of planar technology. Through contacts on the sawn edges of the semiconductor chip are produced if care is taken to ensure that the through contacts are already present in the sawing tracks of the wafer before a saw blade whose thickness is less than the diameter of the through contacts separates the chips at their edges. Through contacts having circle segments in cross section are produced from the cylindrical through contacts during the separation process. If rectangular or triangular through contacts are incorporated into the semiconductor wafer, then after sawing pillar-type structures are produced which in each case have only part of the cross section of the originally introduced quadrangular and triangular pillars, since the central region of each pillar has been sawn out by the dividing operation.

In a further embodiment of the invention, the semiconductor chips comprise memory chips. In memory chips, in particular, there is a need to realize as far as possible a high volume density of memory locations, which is now possible by virtue of the apparatus according to the invention since all lead frames are obviated and no housing structures whatsoever enlarge the volume of the electronic component with stacked semiconductor chips.

Accordingly, the apparatus according to the invention makes it possible to realize extremely compact electronic components, and a further compacting effect can be achieved by thinning the semiconductor chips by grinding. To that end, thinning-by-grinding techniques are employed which reduce the initial thickness of a semiconductor wafer of approximately 500 to 800 $\mu$m by at least one order of magnitude to 50 to 80 $\mu$m, so that a semiconductor wafer having a thickness of hundreds of $\mu$m becomes a semiconductor chip of tens of $\mu$m. If semiconductor chips comprising such wafers that have been thinned by grinding are used for the electronic component according to the invention, then the bulk density of the memory function is increased by at least one order of magnitude.

With the above and other objects in view there is also provided, in accordance with the invention, a method of fabricating an electronic component having semiconductor chips stacked on one another and connected via rewiring planes and through contacts formed at sawn edges of the semiconductor chip. The novel method comprises the following steps:

providing a semiconductor wafer with semiconductor chips arranged in rows and columns and sawing track regions therebetween;

applying an insulating layer for protection and for insulation of an active top side of the semiconductor chips;

forming through contact holes in the sawing track regions, the contact holes having a diameter greater than a width of a saw blade for dicing the semiconductor wafer;

coating an inner wall of the through contact holes with at least one of an adhesion promoter and a solderable surface coating;

filling the through contact holes with solder material to form through contacts;

patterning the insulating layer by uncovering contact areas on the active top side of the semiconductor chip and applying interconnects for rewiring on the insulating layer, the interconnects for rewiring connecting individual contact areas to the through contacts;

dicing the semiconductor wafer to form semiconductor chips; and stacking a plurality of semiconductor chips to form an electronic component.

In other words, the method for fabricating an electronic component having semiconductor chips which are stacked one on the other and are connected via rewiring planes and through contacts, which are arranged on sawn edges of the semiconductor chip, has the following method steps:

provision of a semiconductor wafer with semiconductor chips arranged in rows and columns and sawing track regions provided in between, application of an insulating layer for protection and for insulation of the active top side of the semiconductor chip, introduction of through contact holes in the sawing track regions, whose diameter is greater than the thickness of the saw blade when the semiconductor wafer is divided and separated, coating of the inner wall of the through contact holes with an adhesion promoter and/or a solderable surface coating, filling of the through contact holes with solder material to form through contacts, patterning of the insulating layer with uncovering of contact areas on the active top side of the semiconductor chip and application of interconnects for rewiring on the insulating layer, the interconnects for rewiring connecting individual contact pads to the through contacts, separation of the semiconductor wafer to form semiconductor chips, stacking of a plurality of semiconductor chips to form an electronic component.

This method has the advantage that the majority of the method steps are carried out on the semiconductor wafer itself and, consequently, the method steps are realized simultaneously for many semiconductor chips. What is thus achieved, in principle, is that each semiconductor chip is provided with corresponding through contacts at its sawn edge and has, on its active top side, a rewiring plane with rewiring lines from the contact areas to the through contacts.

After dicing, i.e., division and separation into individual semiconductor chips, with such edge structures and surface structures, the individual semiconductor chips can be stacked one on the other and be connected to one another in the stacked state in a simple heat treatment process wherein the soldering temperature is reached.

In a preferred embodiment of the invention, the interconnects for rewiring are applied to the patterned insulating layer by means of screen printing. Since the interconnects for the rewiring no longer have to be made microscopically small, like the connecting interconnects within the integrated circuit structures, a screen printing method is possible for inexpensive mass production. This screen printing method can be employed on the entire wafer surface, i.e. as a further planar technology step and not for each separated semiconductor chip. Furthermore, for the bottommost semiconductor chips of a stack, it is possible to prepare a wafer which does not have any through contacts but rather provides soldering deposits at the corresponding locations. These soldering deposits then have the task of rising, when the stack is heated to a soldering temperature, in the through contact openings by means of capillary forces as far as the topmost semiconductor chip, if the through contacts are provided continuously as far as the topmost semiconductor chip. For connections which are not intended to reach right down to the base chip, the through contact opening is already filled with soldering material at the wafer level. However, this filling process can also be effected by screen printing.

A further implementation of the method provides for the soldering material to be applied by electrodeposition.

In order to ensure that the through contact openings are wetted with soldering material, in a further exemplary implementation of the method, firstly an adhesion promoter preferably made of titanium or a titanium alloy is applied to the inner wall of the through contacts and then surface layers made of copper, silver or gold or alloys thereof are applied.

This application can be effected with the aid of sputtering technology or CVD deposition (vapor phase deposition).

Through contact holes are introduced into the wafer in the region of the sawing tracks by means of reactive ion etching, laser vaporization and/or by means of electrolytic etching with the aid of cannulae or tubes. The smallest through contact holes can be achieved by means of reactive ion etching, wherein ions are accelerated rectilinearly and impinge on the semiconductor surface in an orthogonal direction, so that virtually perpendicular uniform through holes can be fabricated. Laser vaporization is suitable for larger diameters, wherein process a focused laser beam vaporizes the semiconductor material and can thereby produce a through hole. Larger diameters are achieved by electrolytic etching with the assistance of a cannula, wherein a metal wire which has a diameter of a few micrometers and is at anode potential is arranged within the cannula and a continuous electrolyte current erodes the wafer material at cathode potential.

The orders of magnitude of these through holes are between 10 and 50 $\mu$m in the case of reactive ion etching, between 100 and 250 $\mu$m in the case of laser etching and between 150 and 250 $\mu$m in the case of electrolytic etching. The patterning of the insulating layer with the uncovering of contact areas on the active top side of the semiconductor chip can be achieved by means of a photolithography method or by means of laser sputtering or laser vaporization of the insulating layer in order to uncover the contact areas on the active top side of the semiconductor chip.

In a further exemplary implementation of the method, the interconnect can be applied to the patterned insulating layer by means of screen printing. Since both the contact areas and the interconnects for rewiring can be made relatively wide and are no longer microscopically small, such that they can only be measured using an optical microscope, the interconnects for rewiring can be realized by means of an inexpensive screen printing method directly on the wafer.

In a particular exemplary implementation of the method, before the actual separation, a plurality of semiconductor wafers are stacked one on the other and the through contacts are connected to the interconnects of the rewiring of overlying or underlying semiconductor wafers by means of a thermal treatment. Consequently, only after the semiconductor wafers have been brought together densely packed one on the other are they then separated into stacked semiconductor chips. With this method, practically the planar technology is still used for the stacking of the semiconductor chips. Only after stacked semiconductor wafers are present is the sawing step carried out and automatically produces stacked, interconnected semiconductor chips with a high volume and switching function density.

The connection of the through contacts to the interconnects of overlying or underlying semiconductor wafers of the semiconductor wafers which are stacked one on the other can be achieved by heating the stack of semiconductor wafers to soldering temperature.

In an alternative method, semiconductor wafers are etched from the rear side directly below the contact areas and these etching structures are subsequently metallized. However, such a method cannot be used to obtain narrow step sizes between the through contact holes, since, on account of the crystal direction of the semiconductor, in particular of the silicon, pyramid forms with a sidewall angle of approximately 54° are always formed during etching, as a result of which the opening is significantly larger on the rear side of the wafer than on the front side. This is a considerable problem particularly in the case of unthinned wafers with a thickness of approximately 500 to 800 $\mu$m, since the etching openings can reach 500 $\mu$m or more on the rear side and, consequently, the step size of the contact pads on the front side, which is normally approximately 200 $\mu$m, is completely exceeded. Moreover, such etchings limit the active region of the top side of the semiconductor chip enormously, so that the utilizable area on the active top side is greatly limited.

The computer and software industry demands memory and memory modules with an ever greater storage capacity. Since the available area is also normally limited, the present invention proposes stacking a plurality of wafers one on the other. Stacked semiconductor wafers offer a maximum of storage capacity in conjunction with a comparatively small space requirement.

In one embodiment of the invention, the semiconductor wafer stack comprises a base wafer without through contact holes but with corresponding solder deposits and a number n of additional wafers which, as stack wafers, have been provided with contact holes.

Since the sawing track region between individual semiconductor chips on a semiconductor wafer has a width of between 70 and 120 $\mu$m, such a sawing track is advantageously used for functional tests during chip fabrication. However, hitherto the sawing track has not been supplied for any further use after the completion of the chips. Therefore, the present invention provides for through contact holes to be introduced in the region of the sawing track of the stack wafers, via which holes a vertical contact can then be effected. Consequently, an electronic component comprising stacked semiconductor chips can be fabricated by four work steps:

Step 1. Production of the contact holes in the sawing track region of the stack wafers. In this case, the through contact holes can be dry-etched, for example from the front to the rear side, or be produced by laser boring or by an electrolytic method. The diameter of the holes may reach the width of the storing track regions, i.e. range between 40 and 120 $\mu$m. After the production of the through contact holes, the holes have to be metallized in an electrically conductive manner. This metallization may comprise a plurality of layers, but essentially an adhesion layer and a conductive layer. The conductive layer must be readily wettable by a soft solder. The layer system can be effected either by vapor deposition or by chemical vapor deposition or by physical vapor deposition or else by electrodeposition.

Step 2. The wafers are then provided with a rewiring. In other words, the electrical contacts are covered from the center (or, in the case of contact pads, at the external contacts thereof, but at any rate from the contact areas to the through contact areas). In addition, the base wafer receives, for the rewiring, solder deposits at the locations which later correspond to the contact pads of the overlying wafer.

Step 3. The wafers can then be provided with a double-sided adhesive film which either likewise has metallized contact holes, or the wafers can be bonded onto one another using an adhesive, wherein case care should be taken to ensure that the contact holes are not closed off. It may be necessary, in an additional step, for the through contact hole to be opened again and remetallized. The semiconductor wafers are thus bonded together. For this purpose, the adhesive must be sufficiently thermostable to withstand the subsequent soldering temperatures. The adhesive used may be a polyimide-based adhesive. Further possibilities for connecting the wafers to one another consist in eutectic bonding or else in alloy bonding. To that end, corresponding metal areas are provided on the wafers, which have material components which together form eutectic alloys having a low melting point.

Step 4. The wafers are subsequently heated in a furnace until the solder rises upward through the through contact holes by means of capillary action and thus connects the through contacts to one another.

The following advantages are attained with a method of this type:
  a. An extremely high storage density is achieved.
  b. It is not necessary to keep free any chip area for additional through contacts.
  c. It is possible to use comparatively inexact methods, e.g. electrodeposition, solder paste printing, and hence cost-effective methods.
  d. The wafers can, but need not, be thinned by grinding, so that it is possible to obviate handling and process steps.
  e. Standard wafers, i.e. wafers without special pretreatment, can be used for this method.
  f. The number of stack wafers is not limited and can be increased as desired.

Other features which are considered as characteristic for the invention are set forth in the appended claims.

Although the invention is illustrated and described herein as embodied in a method for fabricating an electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
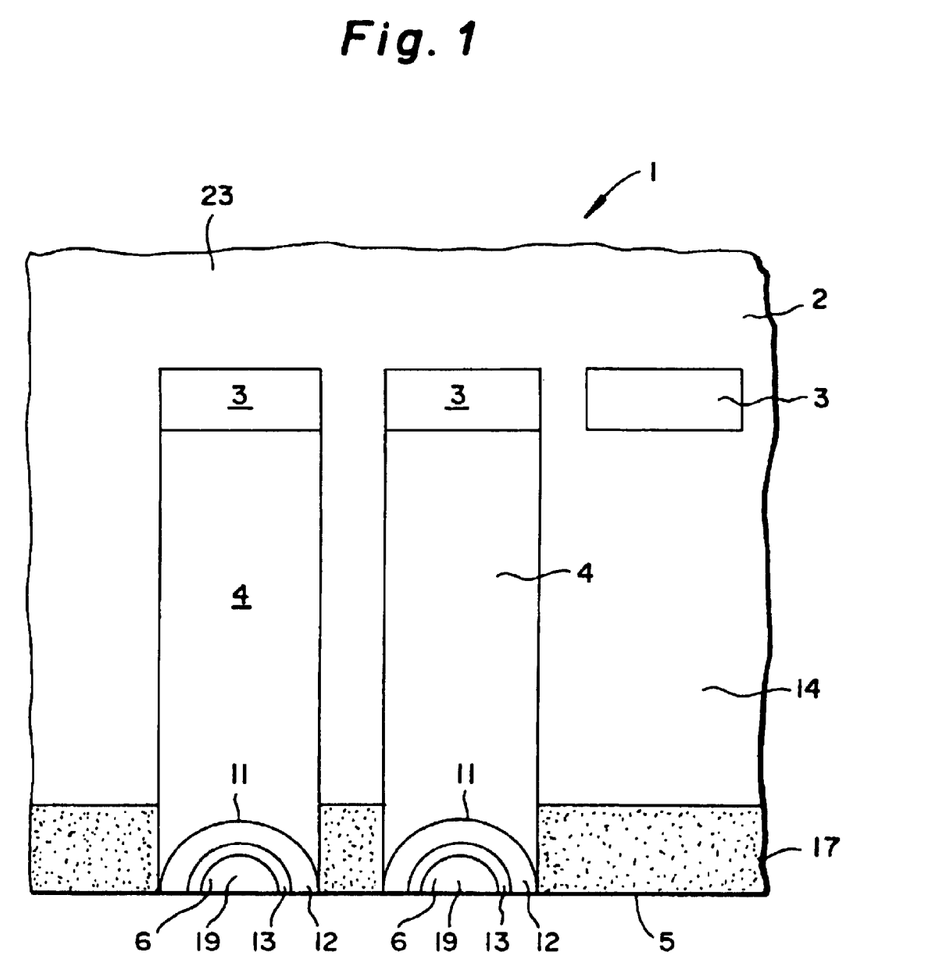
FIG. 1 is a diagrammatic plan view of a detail of an edge region of a semiconductor chip of a first embodiment of the invention.

Referring now to the figures of the drawing in detail and first, particularly, to FIG. 1 thereof, there is shown a diagrammatic plan view of a detail of an edge region 23 of a semiconductor chip 1 of a first embodiment of the invention. The semiconductor chip may have monocrystalline silicon, for example, as semiconductor material. In the edge region 23, contact areas 3 are kept free in an insulating layer 14 on the active top side 2 of the semiconductor chip 1. On the insulating layer 14, interconnects 4 for rewiring extend from the contact areas 3 to through contacts 6 on the edge 5 of the semiconductor chip 1. The edge 5 of the semiconductor chip 1 is produced during the separation of a semiconductor wafer, for example a silicon wafer, by means of sawing technology. To that end, a sawing track region 17 which is kept free of active components of the semiconductor chip 1 is provided in the edge region 23 shown. The through contacts 6 can be introduced into the sawing track region 17 before a semiconductor wafer is divided into semiconductor chips 1. In this case, the through contacts 6 extend over the entire thickness of the semiconductor wafer in the sawing track region 17. In the course of the dividing process using sawing technology, the through contacts 6 at the edge are sawn apart to form pillars with circle segment arcuate cross-sections. It is then possible, via these circle-segment-shaped and pillar-like through contacts arranged at the edge 5 of the semiconductor chip 1, to connect contact areas 3 of different semiconductor chips 1 stacked one on the other via the rewiring lines 4.

The through contacts 6 fabricated on the semiconductor wafer have an inner wall 11 which is firstly bonded to an adhesion promoter to form an adhesion promoting layer 12. In this embodiment, the adhesion promoter comprises titanium or a titanium alloy. A solderable surface coating 13, which, in this embodiment, comprises copper, silver, gold, or an alloy thereof and is only a few nanometers thick, is applied to the adhesion promoting layer 12 for further fabrication of a through contact 6. This solderable surface coating 13 can then be filled with a solder material 19 to form a through contact 6.

The insulating layer 14 on the active top side 2 of the semiconductor chip 1 ensures that the internal wiring of the active top side 2 of the semiconductor chip 1 remains insulated from the interconnects 4 for rewiring, which are provided for the supply voltage, and comprises a polyimide layer in this embodiment. This polyimide layer can be applied by means of screen printing while sparing the contact areas 3 or the polyimide can be applied in a closed manner by means of spinning, spraying on or dipping. Afterward, the contact areas 3 are uncovered again using a photolithography mask. The interconnects 4 for rewiring may likewise be applied by means of a screen printing method or be patterned using vapor deposition technology through a mask.

Figure 2:
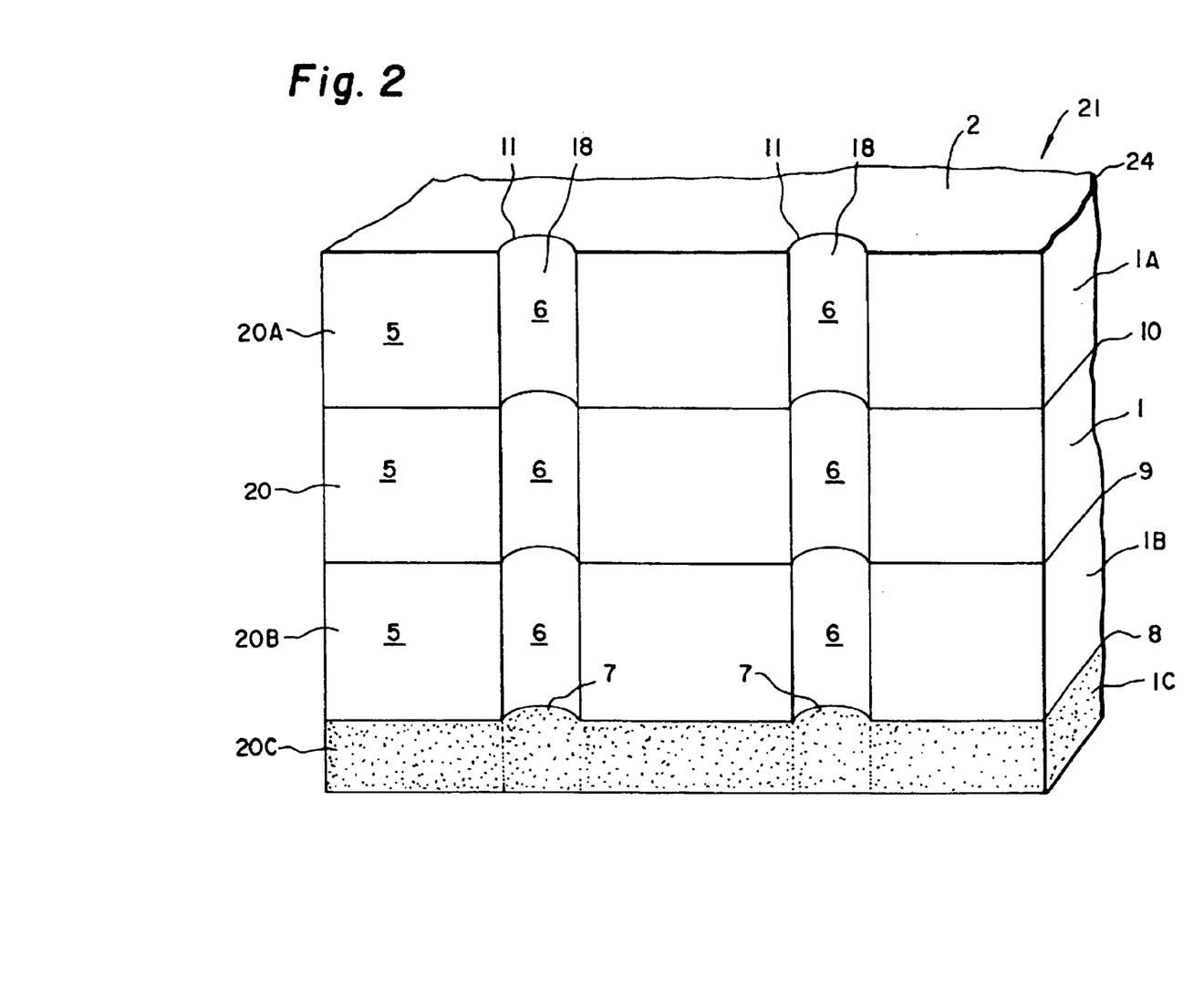
FIG. 2 is a diagrammatic perspective view of a plurality of stacked semiconductor chips of a second embodiment of the invention.

FIG. 2 shows a diagrammatic perspective view of a plurality of stacked semiconductor chips 1, 1A, 1B and 1C of a second embodiment of the invention. In this embodiment, through contact holes 18 aligned one above the other are provided at the sawn edge 5 of the stacked semiconductor chips 1, 1A, 1B and 1C, the inner wall 11 of which holes may be coated with an adhesion promoting layer and a solderable surface coating. Instead of through contact holes 18, the bottommost semiconductor chip 1C has a solder deposit 7 which, when heated, rises by means of capillary action in the through contact holes 18 and forms a through contact.

The stack 21 may comprise semiconductor wafers 20, 20A, 20B and 20C that are not sawn, the bottommost semiconductor wafer 20C having soldering deposits 7 at the locations of the through contact holes 18. Before the semiconductor wafers 20, 20A, 20B and 20C stacked one on the other are actually separated, by heating the stack 21 to soldering temperature, the solder deposit 7 can rise in the through contact holes 18 with corresponding solderable surface coating on account of capillary action and form through contacts through the three overlying stack semiconductor wafers 20, 20A and 20B. Rewiring planes 8, 9, 10 and 24 are arranged on each of the active top sides 2 of the semiconductor chips 1, 1A, 1B and 1C, via which planes the contact areas of the individual semiconductor chips 1, 1A, 1B and 1C are connected to the through contacts 6.

Figure 3:
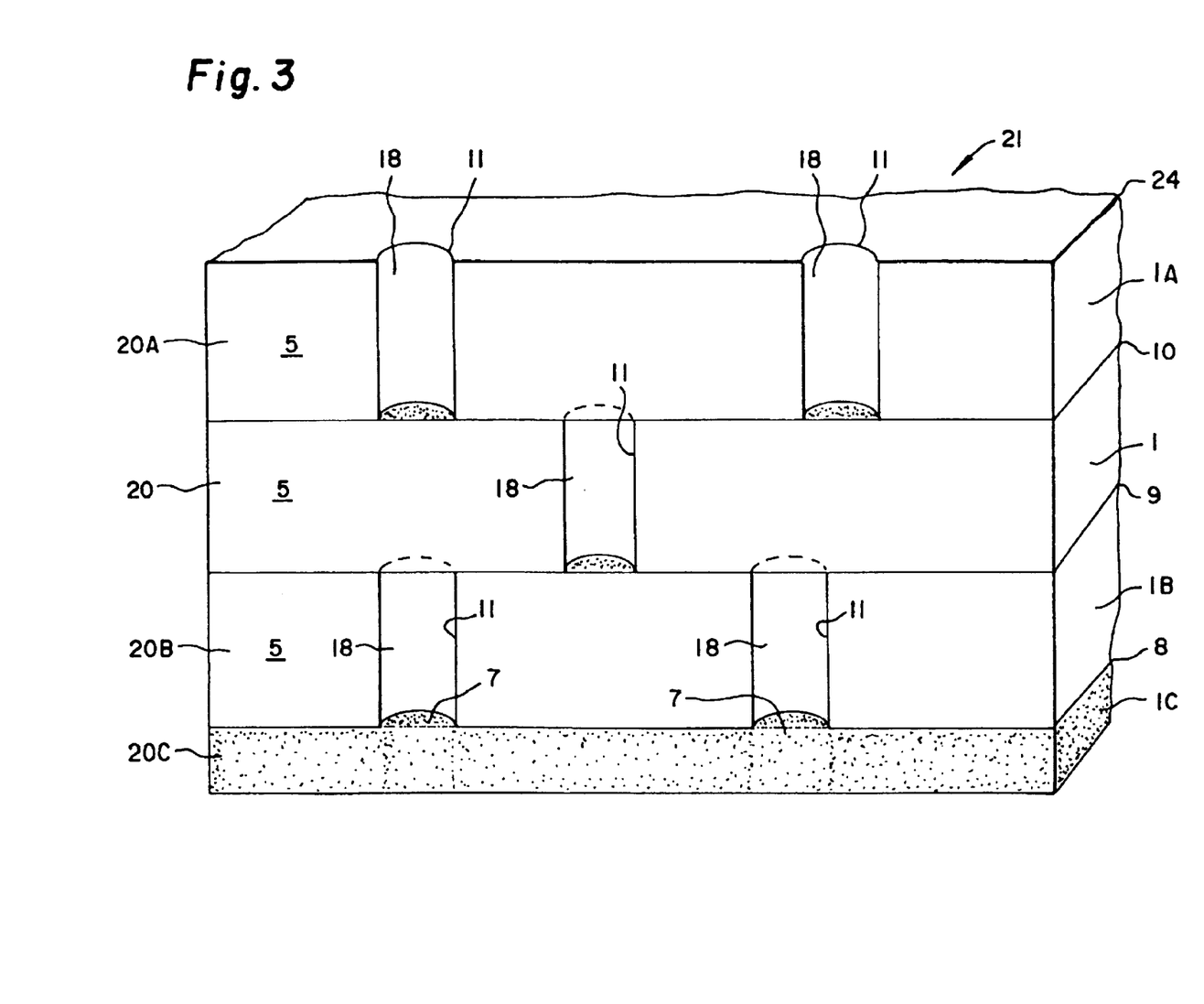
FIG. 3 is a diagrammatic perspective view of a plurality of stacked semiconductor chips of a third embodiment of the invention.

FIG. 3 shows a diagrammatic perspective view of a plurality of stacked semiconductor chips 1, 1A, 1B and 1C of a third embodiment of the invention. Components having the same function as in FIGS. 1 and 2 are identified by the same reference symbols in FIG. 3. One difference between the second embodiment of FIG. 2 and the third embodiment of FIG. 3 is that the through contact holes 18 are arranged offset with respect to one another in the edge regions 5 of the semiconductor chips 1, 1A, 1B and 1C, with the result that it is possible to code the assignments between different contact pads of different semiconductor chips. Such coding helps to realize different addressings particularly in the case of stacked memory elements.

Figure 4:
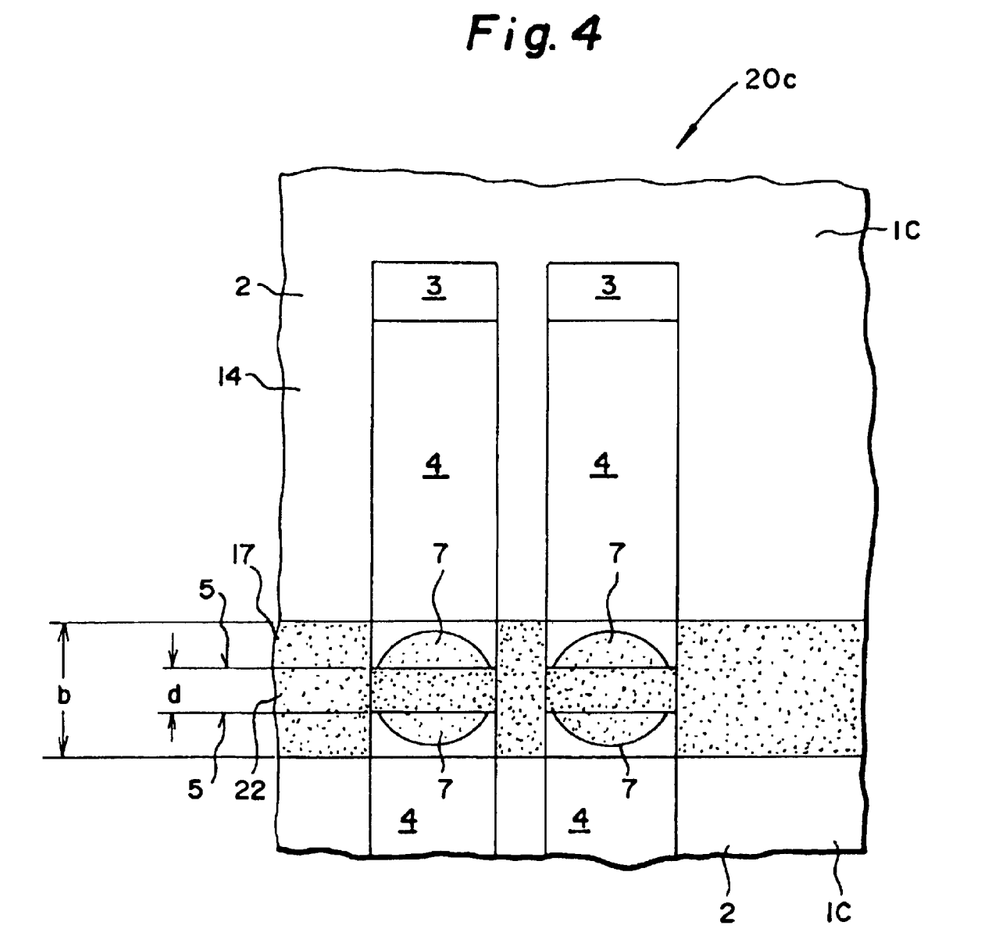
FIG. 4 is a diagrammatic plan view of a surface detail of a semiconductor wafer for bottommost semiconductor chips of stacked semiconductor wafers of a fourth embodiment of the invention.

FIG. 4 shows a diagrammatic plan view of a surface detail of a semiconductor wafer 20C for bottommost semiconductor chips 1C of stacked semiconductor wafers of a fourth embodiment of the invention. In the fourth embodiment of the invention, it is assumed that firstly different semiconductor wafers are prepared and, before actually being divided into individual chips, i.e., diced, are connected to one another in a stacked manner and in a manner provided with intermediate planes and through contacts. Components with the same function as in the previous FIGS. 1–3 are designated by the same reference symbols.

The surface detail of this semiconductor wafer 20C shows a sawing track region 17, surface details of semiconductor chips 1C being arranged on both sides of the sawing track region. The sawing track region 17 has a greater width than required by the actual thickness d of a saw blade. Consequently, the width d of the saw blade track 22 is smaller than the diameter of the solder deposits 7 which are arranged instead of stackable semiconductor wafers with through contact holes on the bottommost semiconductor wafer 20C. A solder deposit 7 has a sufficient quantity of solder to fill overlying through contact holes with solder. The solder deposit is arranged on an interconnect 4 connected to a contact area 3 of the active top side 2 of a semiconductor chip. Only after the stacking of semiconductor wafers comprising a bottommost semiconductor wafer 20C and semiconductor wafers 20, 20A and 20B that can be stacked above the latter is this wafer stack, for example, separated into individual stacked semiconductor chips, the chip edges 5 being produced.

The rewiring planes comprising interconnects 4 and insulating layer 14 become visible at the chip edges 5, the insulating layer 14 insulating the interconnects 4 for rewiring from the internal interconnects of the active top side 2 of the semiconductor chip.

Figure 5:
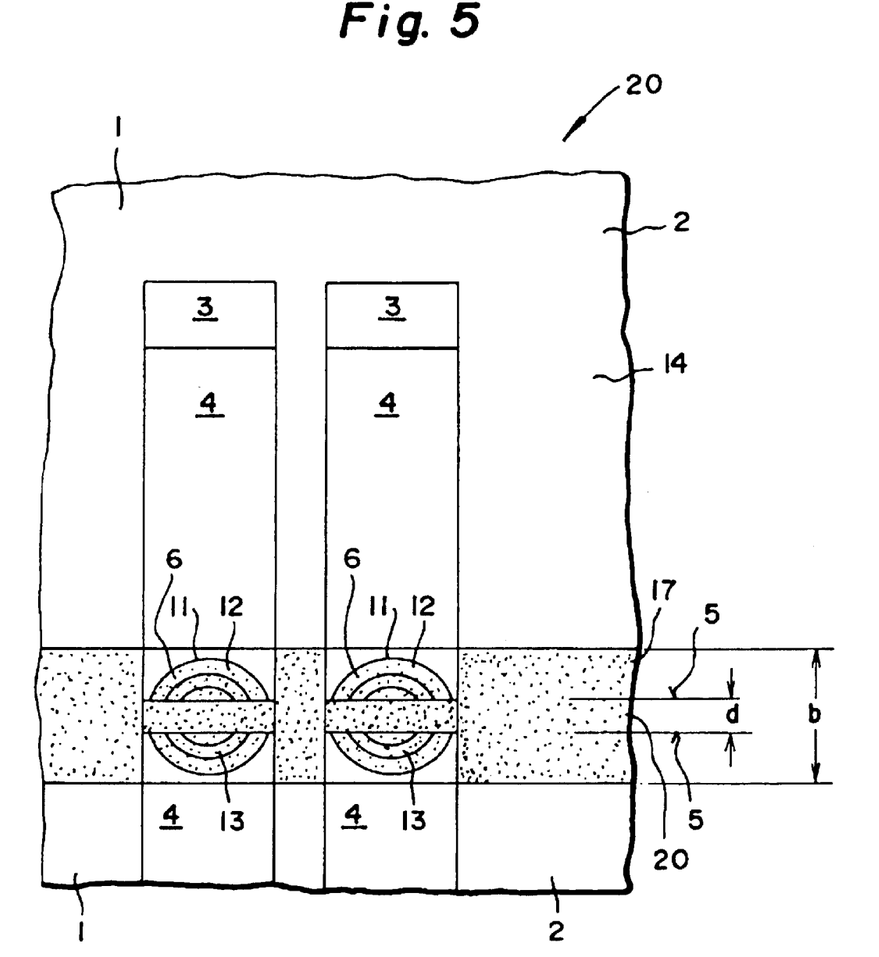
FIG. 5 is a diagrammatic plan view of a surface detail of a semiconductor wafer for stacked semiconductor chips of the fourth embodiment of the invention.

FIG. 5 shows a diagrammatic plan view of a surface detail of a semiconductor wafer 20 for stacked semiconductor chips 1 of the fourth embodiment of the invention. The semiconductor wafer 20 differs from the bottommost semiconductor wafer 20C in that it has through contacts 6. The through contact holes for the through contacts 6 extend over the entire thickness of the semiconductor wafer 20. In this embodiment of the invention, they are fabricated either by laser vaporization or by ion sputtering, or else by reactive ion etching. With these techniques it is possible to achieve relatively small diameters between 50–100 $\mu$m which produce a uniformly shaped cylindrical through hole.

Anodic etching with a thin cannula is also conceivable, wherein, within the cannula, an anode wire having a diameter of a few micrometers provides for an anode potential, while the semiconductor wafer is at negative cathode potential. In the case of the anodic etching of such through contact holes, the diameters that can be achieved are somewhat larger and lie between 100–250 $\mu$m. In the embodiment of FIG. 5, the through contact holes have already been processed to form through contacts in that firstly an adhesion promoting layer 12 made, for example, of titanium or a titanium alloy is applied and then a solderable surface coating made of copper, silver or gold and having a thickness of a few nanometers is applied. This thin solderable surface coating made of a noble metal can be effected by sputtering, vapor deposition or chemical vapor deposition and also physical vapor deposition. After the inner wall of the through contact holes has been prepared in this way, a molten solder from an underlying solder deposit, for example, can rise by capillary action in the through contact hole and fill the latter to form a through contact.

The full width b of the sawing track width is available for fabricating the through contact holes, said width being wider than the actual saw blade track width d, with the result that the diameter of the through contact holes is made less than b and greater than d. On the semiconductor wafer, the sawing track region is kept completely free of active or passive electronic components. The large width b of 70–120 $\mu$m for the sawing track regions 17 is provided in order to protect the active region of a semiconductor chip against microcrack defects caused by the sawing. Such microcrack defects may be linear or two-dimensional crystal defects which extend from the sawing track width and thus from the edge 5 of the sawn semiconductor chip 1 produced.

Figure 6:
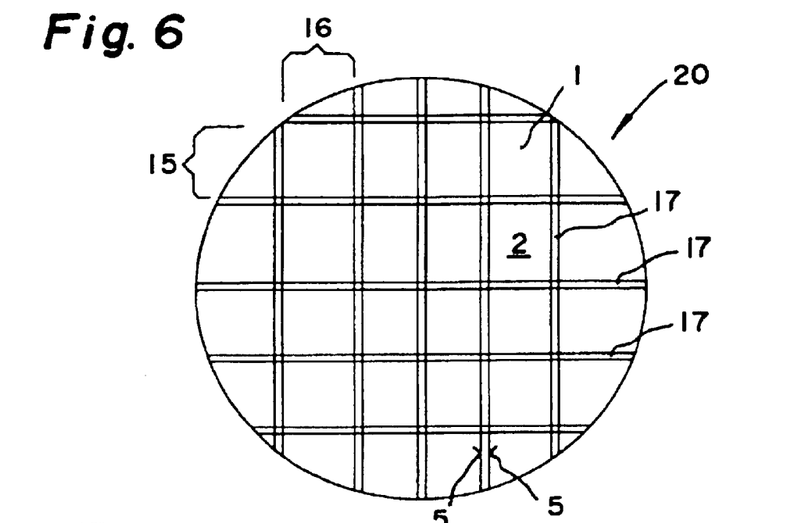
FIG. 6 is a diagrammatic plan view of a semiconductor wafer with sawing track regions.

FIG. 6 shows a diagrammatic plan view onto a semiconductor wafer 20 with sawing track regions 17. Components with the same functions as in the previous figures are identified by the same reference symbols. The arrangement of the semiconductor chips 1 in rows 15 and columns 16 produces sawing track regions 17 which are arranged at right angles to one another and are kept free of active and passive electronic components. The track width lies in the range between 70–120 $\mu$m and therefore suffices for arranging through contacts of 50–100 $\mu$m in that region.

Figure 7:
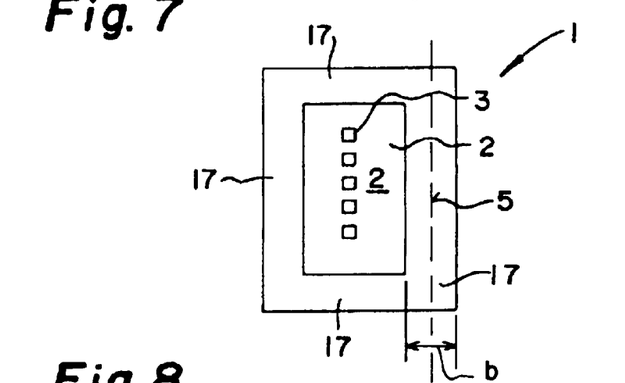
FIG. 7 is a diagrammatic plan view of a semiconductor chip region of a semiconductor wafer with sawing track regions surrounding the semiconductor chip region.

FIG. 7 shows a diagrammatic plan view of a semiconductor chip region of a semiconductor wafer 20 with surrounding sawing track regions 17. Components with the same functions as in the previous figures are identified by the same reference symbols. The semiconductor chip region represented in FIG. 7 has a rectangular active top side 2 with serially arranged contact areas 3, at which internal wirings of the active components of the active top side 2 of the semiconductor chip 1 end. In the state of the semiconductor wafer of FIG. 7, no through contact holes are as yet arranged in the sawing track regions 17. The sawing track width b of the sawing track regions 17 is 70–120 µm in this embodiment.

Figure 8:
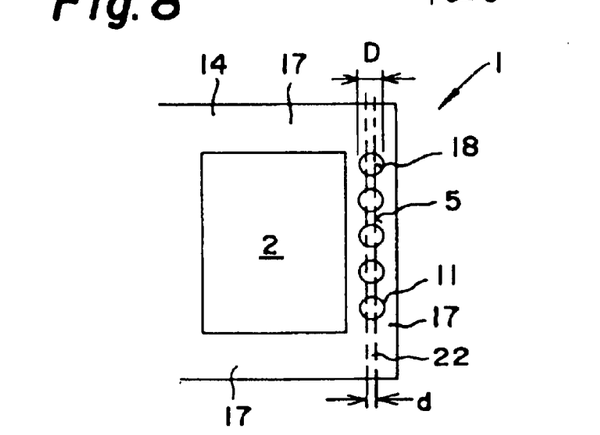
FIG. 8 is a diagrammatic plan view of a semiconductor chip region of a semiconductor wafer with through contacts introduced in the sawing track region of the semiconductor wafer.

FIG. 8 shows a diagrammatic plan view of a semiconductor chip region of a semiconductor wafer 20 with through contact holes 18 introduced in the sawing track region 17. Components with the same functions as in the previous figures are identified by the same reference symbols. The diameter D of the through contact holes 18 is smaller than the sawing track region 17 but larger than the saw blade track 22 and lies between 50–70 µm in this embodiment of FIG. 8. The through contact holes 18 may be provided with an adhesion promoting layer and a solderable surface coating in order to enable a solder bath to fill the through contact holes to form through contacts.

Before the inner walls 11 of the through contact holes 18 are coated with the different metallic coatings, the semiconductor wafer 20 and thus the chip region as well are protected for example by the application of an insulating layer 14. The through contact holes 18 themselves may be introduced by laser vaporization or ion sputtering. During ion sputtering, reactive or inert gas ions are accelerated such that they impinge on the wafer surface in a perpendicular direction and bombard the exposed regions—tightly covered by the protective layer—of the future through contact openings, so that the semiconductor material is sputtered in a perpendicular direction through the wafer. This technique makes it possible to produce very precise through contact holes in a semiconductor wafer.

Figure 9:
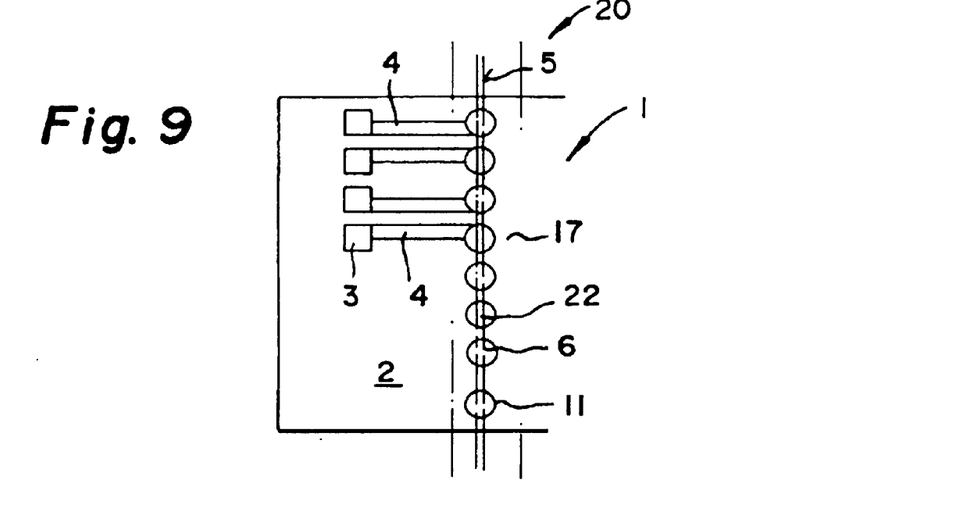
FIG. 9 is a diagrammatic plan view of a semiconductor chip region of a semiconductor wafer with contact areas, interconnects for a rewiring, and through contacts.

FIG. 9 shows a diagrammatic plan view of a semiconductor chip region of a semiconductor wafer 20 with contact areas 3, interconnects 4 and through contacts 6. Components with the same functions as in the previous figures are identified by the same reference symbols. In addition to the opened through contact holes for the through contacts 6, in preparation for the rewiring, the contact areas 3 are uncovered in the protective layer and the rewiring interconnects 4 are subsequently applied by a selective method. Such application of interconnects 4 can be performed using screen printing, for example, especially as the dimensions are already present in orders of magnitude which are suitable for screen printing.

Figure 10:
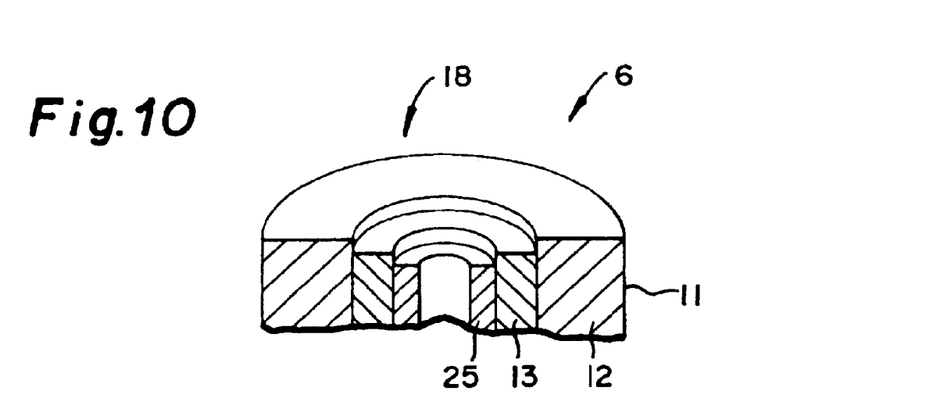
FIG. 10 is a perspective sectional view showing the construction of inner wall coatings of a through hole for a through contact.

FIG. 10 shows a diagrammatic perspective construction of inner wall coatings 11, 12 and 13 of a through contact hole 18 for through contact 6. Components with the same functions as in the previous figures are identified by the same reference symbols. Firstly an adhesion promoting layer 12, which, in this embodiment, comprises titanium or a titanium alloy, is applied to the inner wall 11 of the through contact hole 18. In this embodiment, the adhesion promoting layer 12 is made relatively thick in comparison with the subsequent layers, in order to compensate for expansion differences between the semiconductor material and the subsequent metallic material. In this case, the titanium layer is relatively porous and can therefore relieve thermally induced expansion stresses. The titanium layer can be applied by physical vapor deposition or chemical vapor deposition and/or by vapor deposition. Electrodeposition of the adhesion promoting layer is likewise conceivable. A surface coating having a thickness of a few nanometers for improving the solderability adjoins the adhesion promoting layer. This solderable surface coating 13 may comprise copper, silver, gold or alloys thereof. The central coating 25 may also constitute a complete filling of the through contact hole by a solder.

Figure 11:
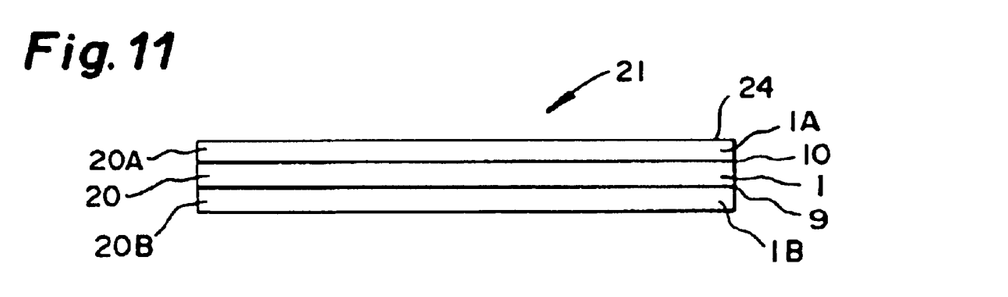
FIG. 11 is a diagram showing the stacking of semiconductor wafers for stacked semiconductor chips of an electronic component.

FIG. 11 diagrammatically shows the stacking of semiconductor wafers 20, 20A and 20B for stacked semiconductor chips of an electronic component. Components with the same functions as in the previous figures are identified by the same reference symbols. In the embodiment according to FIG. 11, three semiconductor wafers 20, 20A and 20B are stacked one on the other. Rewiring planes 9 and 10 are situated between the wafers 20, 20A and 20B. The topmost semiconductor wafer 20A is likewise covered with a rewiring plane 24. Such a stack 21 of semiconductor wafers 20, 20A and 20B is excellently suitable for fabricating a multiplicity of stacked semiconductor chips. After the semiconductor wafers 20, 20A and 20B have been aligned with one another, such a stack is heated to soldering temperature in a heat treatment furnace, so that the solder of each through contact binds to the rewiring lines of the underlying or overlying semiconductor wafer. In this way, compact stacking with corresponding electrical connections can be achieved for a multiplicity of stacked semiconductor chips in a single heat treatment step. This is particularly advantageous for semiconductor wafers having memory devices. In addition, by thinning the semiconductor wafers, the packing density can furthermore be increased by some orders of magnitude, so that a volume packing density not achieved heretofore becomes possible with this technology.

We claim:

1. A method of fabricating an electronic component having semiconductor chips stacked on one another and connected via rewiring planes and through contacts formed at sawn edges of the semiconductor chip, the method which comprises the following steps:

providing a semiconductor wafer with semiconductor chips arranged in rows and columns and sawing track regions therebetween;

applying an insulating layer for protection and for insulation of an active top side of the semiconductor chips;

forming through contact holes in the sawing track regions, the contact holes having a diameter greater than a width of a saw blade for dicing the semiconductor wafer;

coating an inner wall of the through contact holes with at least one of an adhesion promoter and a solderable surface coating;

filling the through contact holes with solder material to form through contacts;

patterning the insulating layer by uncovering contact areas on the active top side of the semiconductor chip and applying interconnects for rewiring on the insulating layer, the interconnects for rewiring connecting individual contact areas to the through contacts;

dicing the semiconductor wafer to form semiconductor chips; and stacking a plurality of semiconductor chips to form an electronic component.

2. The method according to claim 1, wherein the step of forming the through contact holes comprises reactive ion beam etching.

3. The method according to claim 1, wherein the step of forming the through contact holes comprises laser beam vaporization.

4. The method according to claim 1, wherein the step of forming the through contact holes comprises electrolytic cannula etching.

5. The method according to claim 1, which comprises coating the inner walls of the through contact holes with an adhesion promoter selected from the group consisting of titanium and a titanium alloy.

6. The method according to claim 1, which comprises coating the inner walls of the through contact holes with a solderable surface coating selected from the group consisting of copper, silver, gold, and alloys thereof.

7. The method according to claim 1, which comprises coating the inner walls of the through contact holes with a vapor deposition process.

8. The method according to claim 7, which comprises coating the inner walls of the through contact holes with a vapor deposition process selected from the group consisting of chemical vapor deposition and physical vapor deposition.

9. The method according to claim 1, which comprises electroplating the inner walls of the through contact holes.

10. The method according to claim 1, which comprises screen printing the interconnects for rewiring on the patterned insulating layer.

11. The method according to claim 1, which comprises forming a wafer with semiconductor chips to be used as bottommost semiconductor chips of a stack, and forming solder deposits instead of through contacts on the semiconductor wafer of the bottommost semiconductor chips.

12. The method according to claim 1, which comprises stacking a plurality of semiconductor wafers on one another, connecting the through contacts to the interconnects of respectively overlying or underlying semiconductor wafers, and subsequently separating the stacked semiconductor wafers to form stacks of semiconductor chips.

13. The method according to claim 12, wherein the connecting step comprises heating the stacked semiconductor wafers to a soldering temperature.

* * * * *